United States Patent
Honda et al.

(10) Patent No.: US 10,718,611 B2
(45) Date of Patent: Jul. 21, 2020

(54) SEMICONDUCTOR EVALUATION DEVICE AND COMPUTER PROGRAM

(71) Applicant: Hitachi High-Technologies Corporation, Minato-ku, Tokyo (JP)

(72) Inventors: Asuka Honda, Tokyo (JP); Hiroyuki Shindo, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 432 days.

(21) Appl. No.: 14/379,315

(22) PCT Filed: Feb. 8, 2013

(86) PCT No.: PCT/JP2013/052973
§ 371 (c)(1),
(2) Date: Aug. 18, 2014

(87) PCT Pub. No.: WO2013/129077
PCT Pub. Date: Sep. 6, 2013

(65) Prior Publication Data
US 2015/0012243 A1   Jan. 8, 2015

(30) Foreign Application Priority Data
Feb. 28, 2012  (JP) .................................. 2012-040859

(51) Int. Cl.
*G01B 15/00*   (2006.01)
*G01N 23/00*   (2006.01)
(Continued)

(52) U.S. Cl.
CPC ............. *G01B 15/00* (2013.01); *G01N 23/00* (2013.01); *G03F 7/70558* (2013.01);
(Continued)

(58) Field of Classification Search
CPC ... G03F 7/0558; G03F 7/70641; G01B 15/00; G01B 15/04; G01N 23/00; G01N 21/956;
(Continued)

(56) References Cited

U.S. PATENT DOCUMENTS 8,077,962 B2   12/2011  Toyoda et al.
2006/0171593 A1*  8/2006  Hayakawa .............. G06T 7/001
                                                         382/209
(Continued)

FOREIGN PATENT DOCUMENTS

JP   2008-164593 A   7/2008
JP   2009-194051 A   8/2009
(Continued)

OTHER PUBLICATIONS

International Search Report dated May 21, 2013 with English translation (five (5) pages).

*Primary Examiner* — Sujoy K Kundu
*Assistant Examiner* — L. Anderson
(74) *Attorney, Agent, or Firm* — Crowell & Moring LLP (57) ABSTRACT

The present invention provides a semiconductor evaluation device for fabricating a suitable reference pattern utilized in comparison tests. The semiconductor evaluation device and computer program extract a process window in a more accurate range based on a two-dimensional evaluation of the pattern. In order to achieve the above described objects, the present invention includes a semiconductor evaluation device that measures the dimensions of the pattern formed over the sample based on a signal obtained by way of a charged particle beam device, selects a pattern whose dimensional measurement results satisfy specified conditions or exposure conditions when the pattern is formed, and forms synthesized contour data, by synthesizing contour data obtained from images of an identically shaped pattern in design data, and also a pattern formed under the selected
(Continued)

exposure conditions or a pattern having a positional relation that is already known relative to the selected pattern.

8 Claims, 9 Drawing Sheets

(51) Int. Cl.
    *H01J 37/02*     (2006.01)
    *G03F 7/20*     (2006.01)
    *H01L 21/66*     (2006.01)

(52) U.S. Cl.
    CPC .......... *G03F 7/70641* (2013.01); *H01J 37/02* (2013.01); *H01L 22/12* (2013.01)

(58) Field of Classification Search
    CPC ..... G01N 21/9501; H01L 22/10; H01L 22/12; H01J 37/02; G06T 2207/30148
    See application file for complete search history.

(56) References Cited

U.S. PATENT DOCUMENTS

| | | |
|---|---|---|
| 2008/0130982 A1 | 6/2008 | Kitamura et al. |
| 2009/0041332 A1 | 2/2009 | Bhaskar et al. |
| 2009/0202139 A1* | 8/2009 | Toyoda ................ G06K 9/6255 |
| | | 382/145 |
| 2010/0329540 A1 | 12/2010 | Bhaskar et al. |
| 2011/0235895 A1 | 9/2011 | Kitamura et al. |
| 2012/0328181 A1 | 12/2012 | Kitamura et al. |
| 2013/0070078 A1 | 3/2013 | Takagi et al. |

FOREIGN PATENT DOCUMENTS

| | | |
|---|---|---|
| JP | 2010-534408 A | 11/2010 |
| JP | 2011-141133 A | 7/2011 |
| JP | 2013-195175 A | 9/2013 |

* cited by examiner

| Process condition | | CD value 1 | CD value 2 | Average EPE | Curvature | Area ratio |
|---|---|---|---|---|---|---|
| Focus | Dose | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |
| | | | | | | |

SEMICONDUCTOR EVALUATION DEVICE AND COMPUTER PROGRAM

TECHNICAL FIELD

The present invention relates to a semiconductor evaluation device and computer program, and relates in particular to a preferred semiconductor evaluation device and computer program that extracts exposure conditions appropriate for the exposure device.

BACKGROUND ART

In recent years as semiconductor devices are manufactured to an ever higher degree of integration, there are increasing demands for setting a higher accuracy for lithography process conditions. Moreover, along with higher integration, demands are also becoming more severe for accurately finding a process window showing the dose range and focus range of the exposure device for manufacturing patterns at a high accuracy. Patent document 1 discloses a pattern evaluation method that synthesizes the contours of two or more identical patterns and utilizes this synthesized contour as a reference pattern. Patent document 1 describes performing a pass/fail inspection by utilizing this reference pattern as an object for comparison.

CITATION LIST

Patent Literature

Patent literature 1: Japanese Unexamined Patent Application Publication No. 2009-194051

SUMMARY OF INVENTION

Technical Problem

On the other hand, in order to find exposure conditions for the exposure device, a FEM (Focus Exposure Matrix) wafer is utilized for varying the dose and focus of the exposure device over one wafer and forming a pattern for each different condition combination. The dose and focus conditions for forming the pattern can be found by evaluating the pattern formed over the FEM wafer and selecting an appropriate pattern.

To find this evaluation pattern, a reference pattern such as disclosed in patent document 1 can then be formed and a two dimensional shape comparison can be made by utilizing this reference pattern in inspections. Variations in the dose and focus appear as changes in the two dimensional shape of the pattern and so the reference pattern formed by the method disclosed in patent document 1 is effective for finding appropriate exposure conditions.

However, selecting a pattern shape that is as close to an ideal pattern shape is required when forming the reference pattern, but discovering such a pattern is extremely difficult in a state where there are no criteria for an ideal pattern shape.

A semiconductor evaluation device and a computer program with the object of forming an appropriate reference pattern are described next. Moreover, a semiconductor evaluation device and a computer program with another object of extracting a process window in the more accurate range is described based on a two dimensional evaluation of the pattern.

Solution to Problem

According to one aspect of the present invention for achieving the above described objects, the present invention proposes a semiconductor evaluation device or a computer program in which the dimensions of the pattern formed over the sample are measured based on a signal obtained by way of a charged particle beam device; a pattern whose dimensional measurement results satisfy specified conditions, or an exposure condition when forming the pattern is selected; synthesized contour data is formed by forming synthesizing contour data obtained from images of patterns fabricated via the selected exposure conditions, or patterns having a positional relation that is already known relative to the selected pattern and identical shaped patterns in the design data; and the pattern information obtained based on the images is evaluated by utilizing the synthesizing contour data as reference pattern.

Advantageous Effects of Invention

The above described structure is capable of forming a reference pattern utilized for comparative measurement of a pattern or for an inspection, etc.

DESCRIPTION OF EMBODIMENTS

An example of implementing a process window analysis and hotspot observation based on the two dimensional evaluation of the pattern by utilizing a reference pattern is described next. Performing a process window analysis allows finding the optimum dose quantity and optimum focus value.

In process window analysis, exposure process conditions, images of the chip captured under changed exposure conditions, and measurement values are input, and an analysis is performed for the process window of light exposure.

In process window analysis, a graph is made to show the relation between the measurement value and focus value or dose quantity of the light exposure; and a graph for clarifying the effective range of the focus value and dose quantity of the light exposure.

Figure 1:
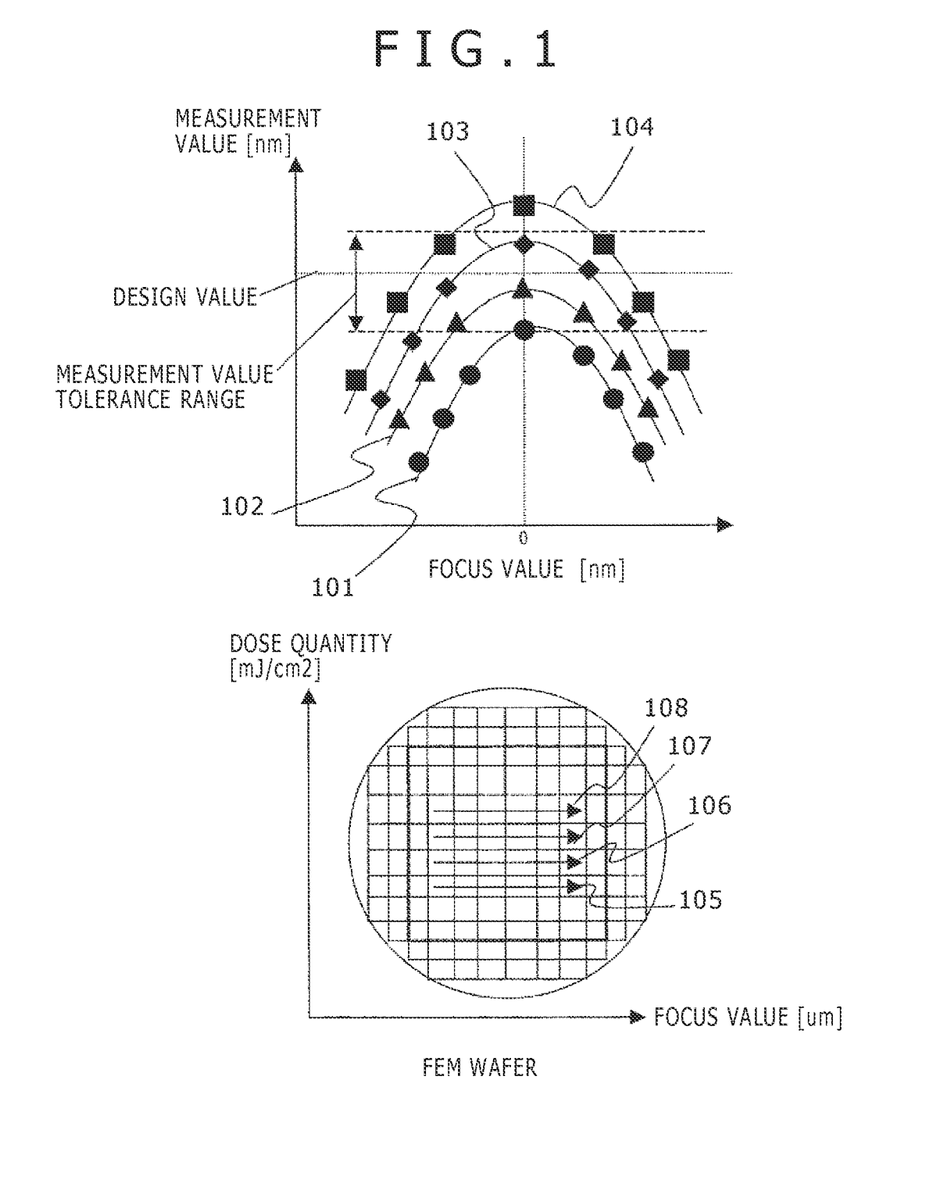
FIG. 1 is graphs showing the relation between the measurement value and light exposure focus value or dose quantity.

FIG. 1 is an example of making graphs showing the relation between the measurement value and the light exposure focus value or dose quantity. The graphs are normally utilized while associated with a FEM (focus exposure matrix) wafer made by changing the focus value and dose quantity.

The black circles on the graph show the measurement values for each shot. Line 105 of the FEM wafer for each dose quantity corresponds to 101 on the graph. The lines 106, 107, and 108 for each dose quantity of the FEM wafer respectively correspond to 102, 103, and 104 on the graph the same as the line 105.

Figure 2:
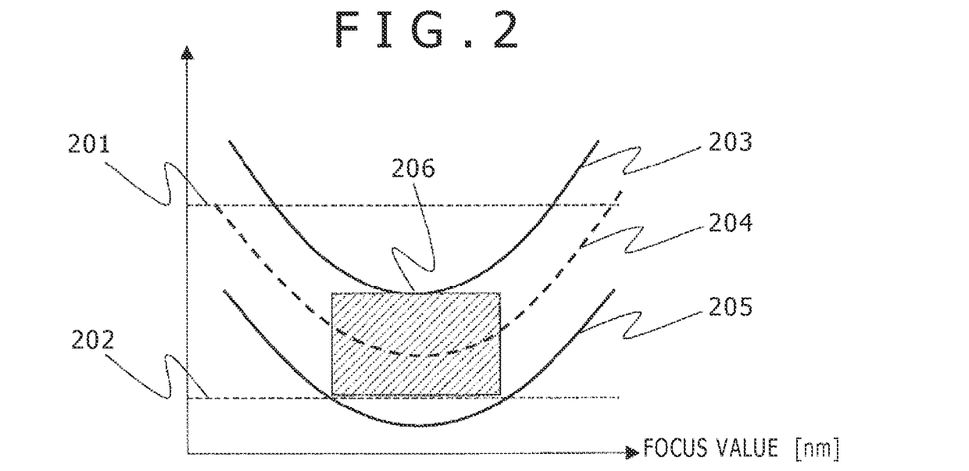
FIG. 2 is an example of a graph for clarifying the effective range of the focus value and dose quantity of the light exposure.

FIG. 2 shows an example of making a graph for clarifying the effective range of the focus value and dose quantity of the light exposure. The process window is calculated from the focus value, dose quantity, and measurement value in the graph showing the relation between the measurement value and focus value or dose quantity of the light exposure.

A quadratic function approximation is performed on each dose quantity for change in the measurement value relative to change in the focus value shown in the graph showing the relation between the measurement value and focus value or dose quantity of the light exposure. An approximation formula is then calculated by correlation processing of the measurement value and dose quantity for identical focus values, the range is calculated for each focus value of the dose quantity from the maximum and the minimum measurement values, and the range for the dose quantity of each focus value is drawn. The process window 206 is calculated from the range that is drawing range and condition values (dose quantity upper threshold value 203 and dose quantity lower threshold value 205, etc.).

On the other hand, as the semiconductor manufacturing process become more complicated and micronized, process window analysis and hotspot observation of one dimensional shapes are no longer adequate and two dimensional shape measurement is also required.

However, high accuracy two dimensional evaluations cannot be achieved without establishing a method to evaluate two dimensional shapes. High accuracy pattern evaluations and specifying manufacturing conditions based on pattern evaluations is in particular impossible unless requirements for a standard pattern (reference pattern) for carrying out comparative evaluations of two dimensional shapes to serve as comparison object are satisfied. A shape as near as possible to an ideal shape (pattern shape formed by appropriate exposure conditions) is preferably selected as the reference pattern but extracting such a pattern shape is difficult at a stage where manufacturing conditions have not yet been set. Fabricating a reference pattern after first visually checking the pattern shape has also been considered but the shape might possibly vary due to subjective impressions of the person making decisions. Moreover, the reference pattern must be fabricated after a judgment by the person making decisions, so automating the process is impossible.

The semiconductor evaluation device for fabricating a reference pattern for making an appropriate two dimensional evaluation and a computer program to form the reference patterns by a computer is described next.

Moreover, an example for automating the process up to the narrowing the joint process window used for the one dimensional shape and the two dimensional shape is also described by using the measurement values for the one dimensional shape and two dimensional shape.

In the following described embodiments, a pattern formed by way of exposure conditions from the best (or satisfying the specified conditions) dose quantity and focus value obtained as process window analysis results for a one dimensional shape is applied in particular to forming reference patterns. More specifically, a pattern is extracted for a specified relation (for example containing the difference with the design data, etc., within a specified range) or design data or simulation results nearest the one dimensional measurement results for a specified section of the pattern, and a pattern formed under the same exposure conditions as the object pattern and having plural identical shapes is selected, and is utilized to generate the reference pattern.

The reference pattern formed in this way can serve as a suitable object for comparison seen from the standpoint of one dimensional measurement results, and high-accuracy exposure conditions can be further narrowed down by utilizing this reference pattern for making two dimensional evaluations.

When narrowing down the exposure conditions, by superimposing the process window analysis results based on the two dimensional evaluation results, onto the process window analysis results obtained from the one dimensional measurement results, a more appropriate region can be identified by way of an overlapping region containing a region in the process window selected as an appropriate region according to one dimensional evaluation results, and a region in the process window selected as an appropriate region according to two dimensional results.

By utilizing a method to set a target pattern or exposure condition for generating a reference pattern based on one dimensional results as described above, an accurate shape having no deterioration in shape can be utilized as a reference standard by establishing a reference pattern from the estimated coordinates of the best dose quantity and a focus value found from the process window analysis for one dimensional shapes.

Also, by automatically finding the measurement values for the two dimensional shape and inputting the measurement values for the first dimensional shape and two dimensional shape, a joint process window for the first dimensional shape and two dimensional shape can be automatically narrowed down.

The analysis target of the process window is a pattern formed over the FEM wafer. The FEM wafer is a wafer chat is formed by changing the focus value on the horizontal axis and the dose quantity on the vertical axis of the wafer map for each shot. The difference in pattern forming due to the change in dose quantity and focus value of the light exposure allows making an evaluation by comparing the measurement value for each shot. The vertical axis and the horizontal axis on the FEM wafer correspond to the focus value and dose quantity.

Process window analysis of patterns formed over an FEM wafer is implemented only on one dimensional shapes, however the complexity and micronizing of the semiconductor manufacturing process has made measurement of two dimensional shapes also essential.

However, a method for evaluation of two dimensional shapes has not currently been established and there is the problem that two dimensional shapes must be evaluated visually.

Automating the evaluation of two dimensional shapes can eliminate visual two dimensional shape evaluations and moreover the process up to narrowing down a joint process window utilizing measurement values for a one dimensional shape and a two dimensional shape can also be implemented automatically.

Figure 3:
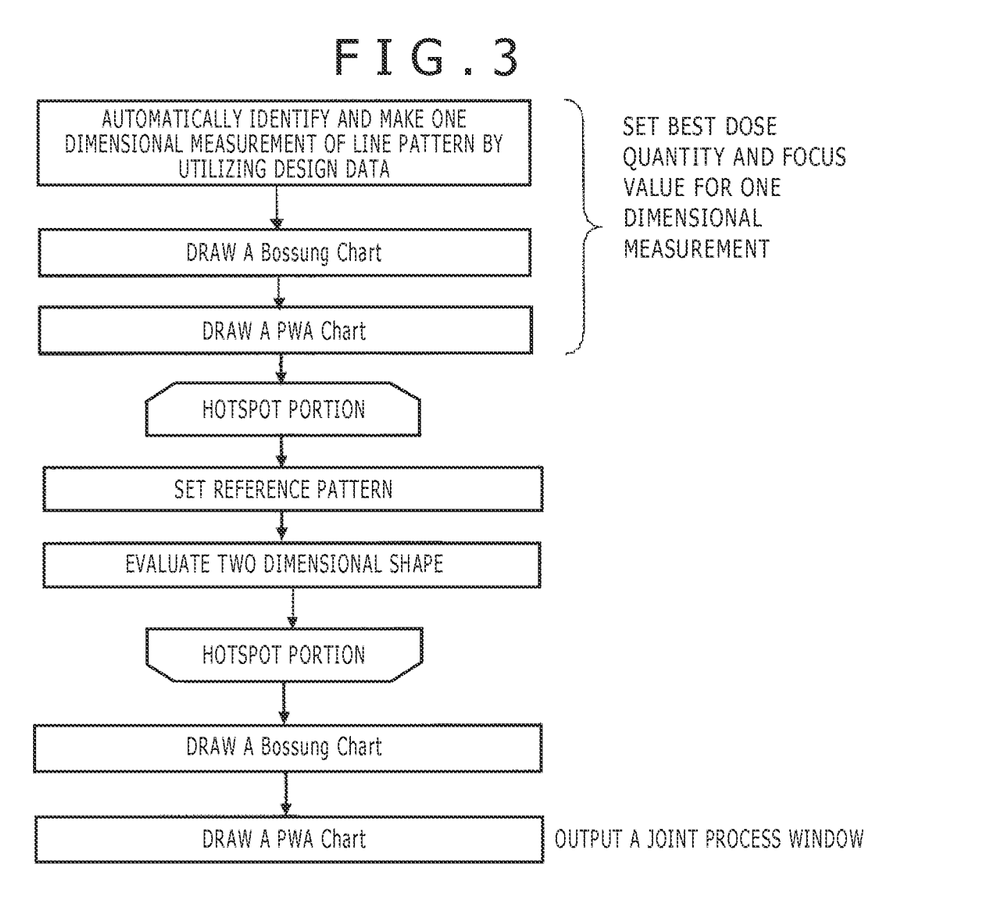
FIG. 3 is a flow chart showing the process narrowing the process window based on the one dimensional measurement results and two dimensional evaluation results.

FIG. 3 is a drawing showing the flow up to narrowing down the joint process window for a one dimensional shape and a two dimensional shape linked with a two dimensional shape evaluation.

A method for automatically narrowing down the joint process window utilizing measurement values for a one dimensional shape and a two dimensional shape is described next. The process window analysis for a one dimensional shape is first of all performed. The best dose quantity and focus value are found from the process window. In process window analysis for a one dimensional shape, measurement data for chips with different processing conditions is input. The design data is utilized, line pattern is automatically identified, and measurement of a one dimensional shape is implemented.

After process window analysis of a one dimensional shape, a contour is extracted at estimated coordinates for the best dose quantity and focus value that are found, and a reference pattern for use in two dimensional shape evaluation is set. The two dimensional shape evaluation utilizes methods such as described later on and quantizes the shape difference between the reference pattern and comparison pattern.

Figure 4:
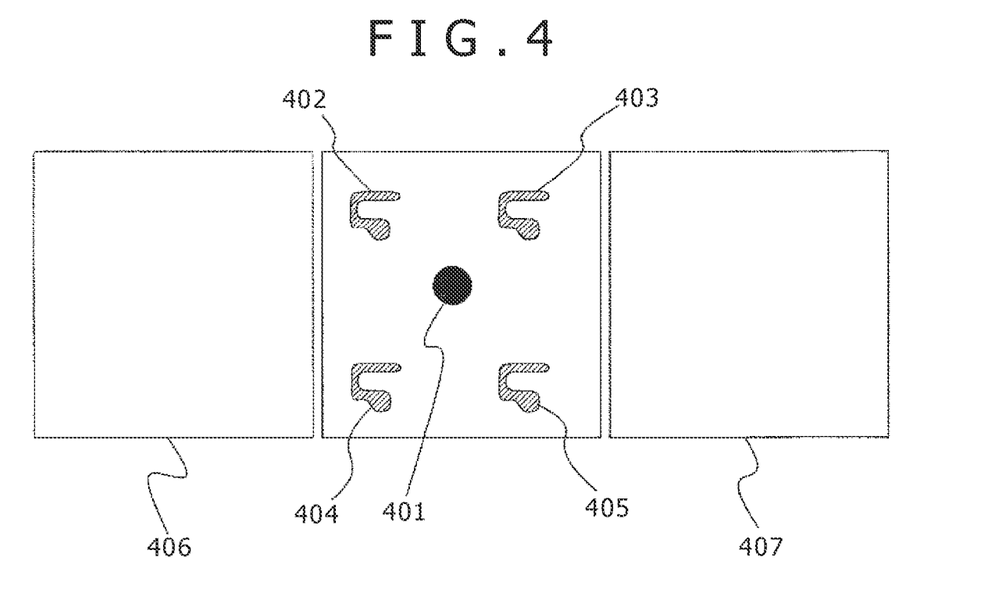
FIG. 4 is a (first) drawing for describing an example of selecting exposure conditions based on the one dimensional measurement and forming the reference pattern based on the selection.

The reference pattern typically utilizes design data or simulation shapes as a standard pattern. However, a reference pattern must be set when there are no simulation shapes. FIG. 4 shows one method that uses a pattern with conditions identical to a contour found by way of estimated coordinates for the best dose quantity and focus value. The patterns 402, 403, 404, and 405 having the same conditions as the estimated coordinate 401 for the best dose quantity and focus value are averaged and set as the reference patterns. The peripheral conditions 406 and 407 are not set as targets for averaging.

A reference pattern having no deterioration in shape can be set in order to average patterns captured under conditions identical to the contour found in estimated coordinates for the best dose quantity and focus value. Moreover, performing averaging also has the advantage that the contour becomes smooth by averaging a number of patterns even if there is deterioration in pattern shapes due to roughness.

Figure 5:
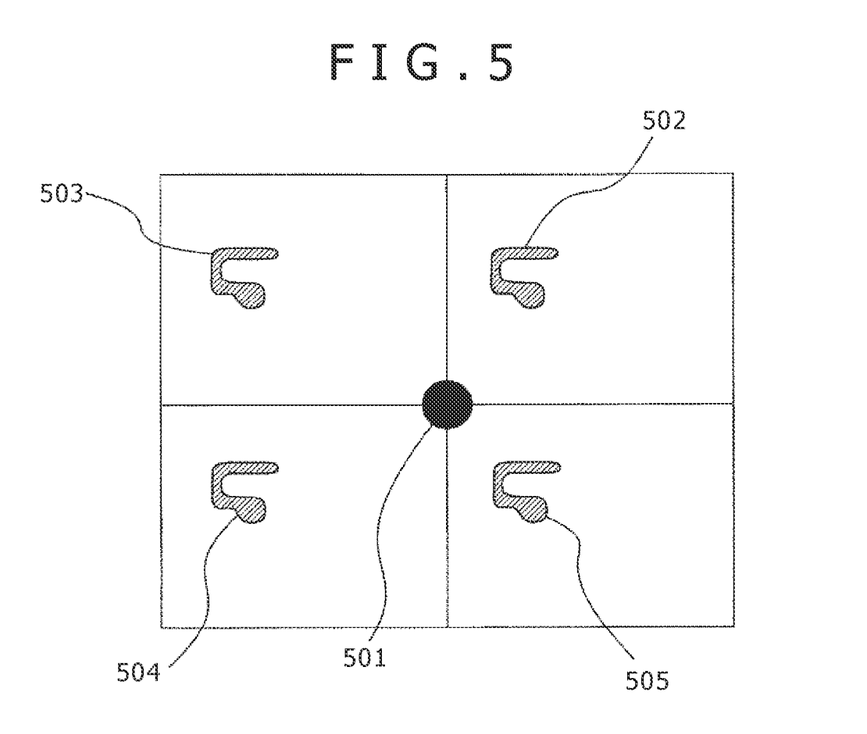
FIG. 5 is a (second) drawing for describing an example of selecting exposure conditions based on the one dimensional measurement and forming the reference pattern based on the selection.

FIG. 5 shows a different method that uses a peripheral pattern of estimated coordinates for the best dose quantity and focus value. The peripheral patterns 502, 503, 504, and 505 at the estimated coordinate 501 for the best dose quantity and focus value are averaged and the reference pattern when averaged under identical conditions has some differences that appear in the shape but by averaging the peripheral patterns the results can be obtained having minimal, differences in shape over a wide range during evaluation of two dimensional shapes.

Yet another method is using a contour extracted by the best dose quantity and focus value. Roughness can intrude even when the contour is extracted with estimated coordinates for the best dose quantity and focus value. In such cases, applying smoothing to the extracted contour will make the contour smoother so that a reference pattern having no deterioration in shape can be obtained.

Setting the reference pattern and evaluating the two dimensional shape can be performed by hotspot portion. The reference pattern is set from a range guaranteed by the process window analysis that targets one dimensional shapes so that a two dimensional shape having minimal shape differences contained within the range guaranteed by process window analysis that targets one dimensional shapes, can be evaluated by comparing the contour extraction results with an accurate reference pattern.

Figure 6:
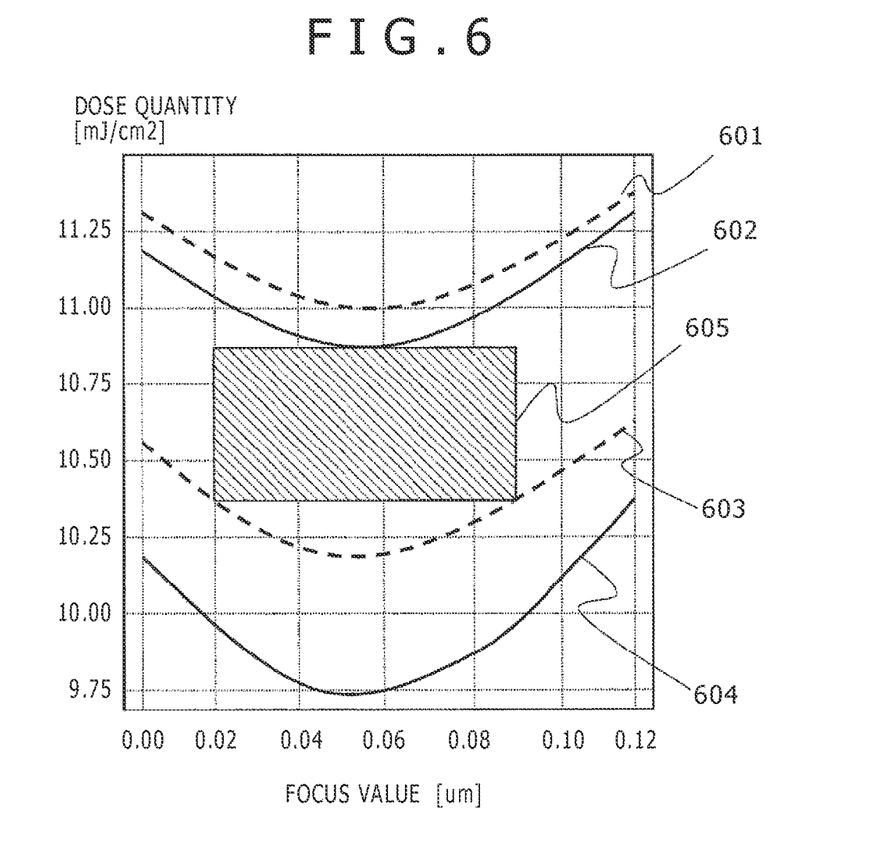
FIG. 6 is an example of forming a process window based on measurement values for a one dimensional shape and a two dimensional shape.

FIG. 6 is an example of process window forming process window based on measurement values for a one dimensional shape and a two dimensional shape. Expressing the one dimensional measurement value 601, 603 and the two dimensional measurement values 602, 604 in a graph showing the relation between the dose quantity and the focus value for light exposure clearly defines the common process margin region of the measurement values for the one dimensional and two dimensional shapes. The region covering the one dimensional and two dimensional shape measurement values forms the one dimensional and two dimensional joint process window 605.

Making an automatic evaluation of the two dimensional shape allows eliminating visual evaluations of two dimensional shapes and also allows automatic narrowing down the common tolerance fluctuation region based on one dimensional and two dimensional shape measurement values.

Figure 7:
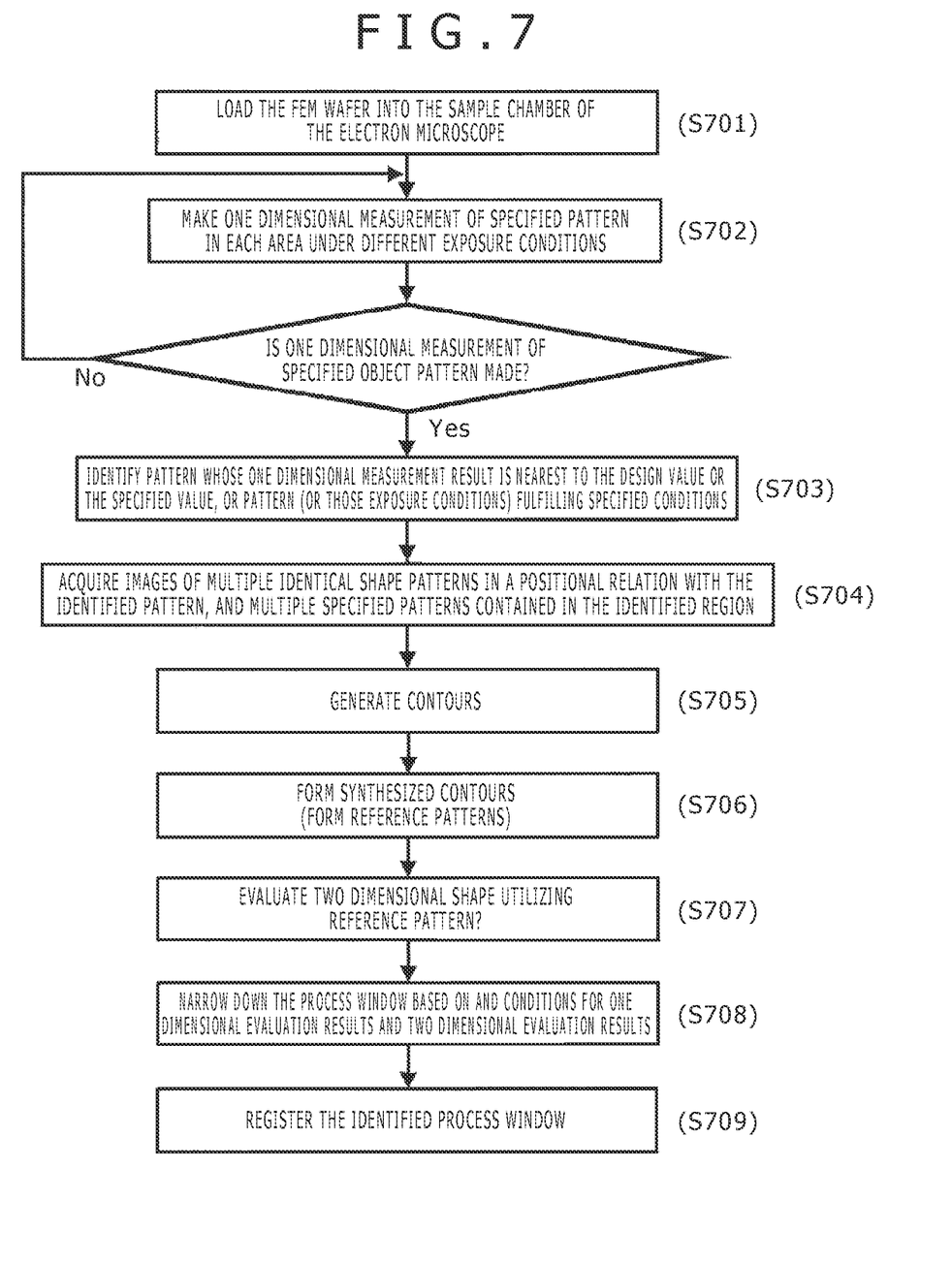
FIG. 7 is a flow chart showing the process for selecting a reference pattern based on the one dimensional measurement and pattern evaluation utilizing the reference pattern.
Figure 12:
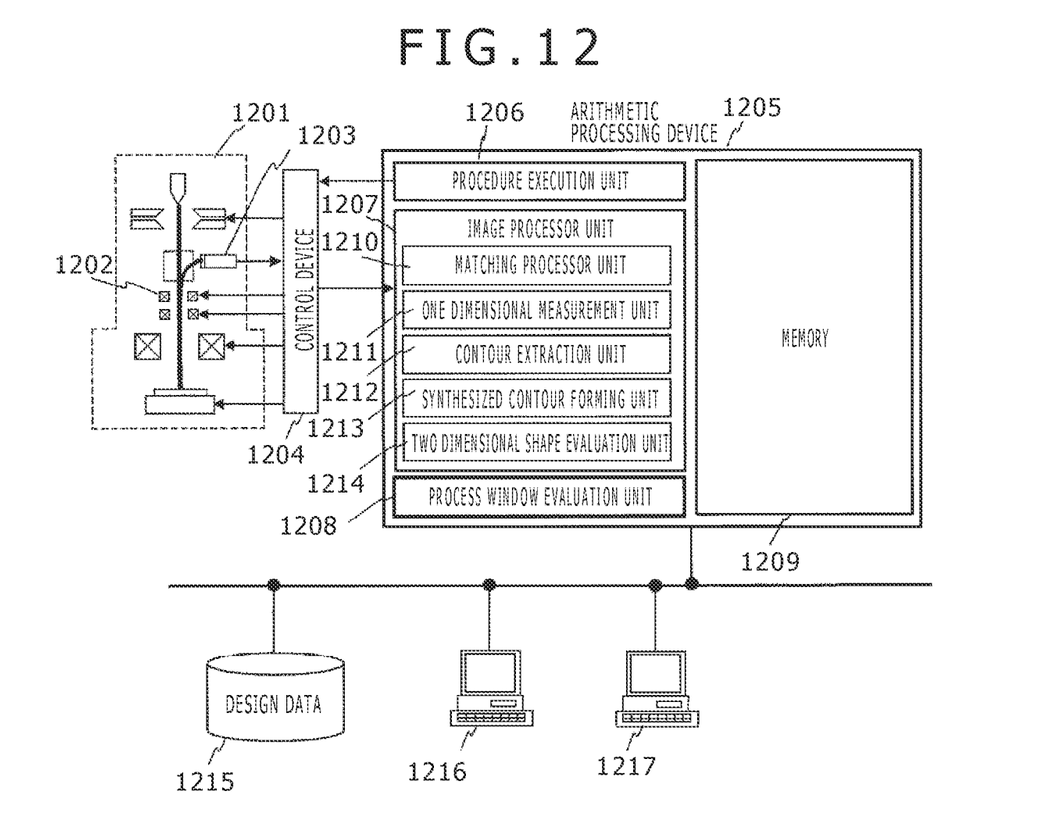
FIG. 12 is a drawing showing one example of a semiconductor evaluation system.

The device and computer program for selecting a reference pattern based on evaluation results obtained by one dimensional evaluation is describe in more detail next while referring to the flow chart in FIG. 7. FIG. 12 is an overall view of the semiconductor evaluation system for forming the reference pattern and performing process window analysis while referring to the flow chart in FIG. 7. Along with conveying control signals based on a scanning electron microscope unit 1201, a control device 1204 for controlling the scanning electron microscope unit, and a specified operating program (recipe or procedure) for the control device 1204, the semi conductor evaluation system further includes an arithmetic processing device 1205 for making the dimensional measurements and the shape evaluation of the pattern from the signals (such as secondary electrons and backscattered electrons obtained by the scanning electron microscope, a design data storage medium 1215 storing semiconductor device, design data, a simulator 1216 for simulating the pattern based on the design data, and an input-output device 1217 for inputting the specified semiconductor evaluation conditions, and outputting the measurement results and process window analysis results.

The arithmetic processing device 1205 functions as an image processor device for forming a contour from the obtained image. The control device 1204 controls the deflector and sample stage within the scanning electron microscope unit 1201, and performs positioning to the desired scanning range (visual field) based on instructions from the procedure execution unit 1206. Scanning signals (varying) according to the setting scale and size of the visual field are supplied from the control device 1204 to the scanning deflector 1202. The scanning deflector 1202 changes the size of the visual field (scale) to a desired size according to the supplied signals.

The image processor unit 1207 contained within the arithmetic processing device 1205 includes an image processor unit 218 to perform image processing of the image obtained by arraying the detection signals from the detector 1203 while synchronizing with the scanning of the scanning detector 1202. The arithmetic processing device 1205 contains a process window evaluation unit. 1208 for evaluating the process window based on measurements and evaluation results in the image processing unit 1207, and a memory 1209 to store the required operating program, image data, and measurement result, etc.

The arithmetic processing device 1205 includes a matching processor unit 1210 to perform template matching by using the pre-stored template image; a one dimensional measurement unit 1211 to form a luminance waveform profile based on a detection signal and measure the pattern dimensions by measuring the dimensions between the peaks of the profile; a contour extraction unit 1212 to extract the contour from the image data described later on; a synthesized contour forming unit 1213 to synthesize the plural acquired contours; and a two dimensional shape evaluation unit 1214 to evaluate the two dimensional shape by utilizing the reference pattern data formed by the synthesized contour forming unit 1213.

The electrons emitted from the sample are captured by the detector 1203, and are converted to digital signals in the A/D converter within the control device 1204. Image processing hardware such as a CPU, ASIC, FGPA within the image processing unit 207 performs image processing according to the objective.

The arithmetic processing device 1205 is coupled to the input-output device 1217 and includes functions such as of a GUI (Graphical User Interface) for displaying images and inspection results to the operator on a display device mounted within the input-output device 1217.

All or a portion of the processing and control in the arithmetic processing device 1205 can be processed, and controlled by assignment to a computer containing a memory capable of storing the accumulated images or CPU. The input-output device 1217 is also capable of functioning as an apparatus for generating image capture protocols or procedures for generating image capture protocols or procedures including electronic device coordinates required for measurements and inspections, pattern matching templates utilized in positioning, and image capture conditions manually or by utilizing the design data stored in the design data storage medium 1215 of the electronic device.

The input-output device 1217 contains a template generator unit that extracts a portion of the diagrammatic image formed based on the design data to generate a template and the template is registered in the memory 1209 as a template for template matching in a matching processor unit 1210. Template matching is a technique that specifies a point where the captured image for position alignment matches the template based on a matching decision utilizing zing a normalizing correlation method, etc. The matching processor unit 1210 specifies a desired position for the captured image based on the matching decision. In the present embodiment, the extent of the match between the template and the image is expressed by the words coincidence and degree of similarity however both words are the same in terms of significance as a marker showing the extent to which both are a match. Also, the mismatch and degree of non-similarity are one expression of the coincidence and degree of similarity.

Figure 13:
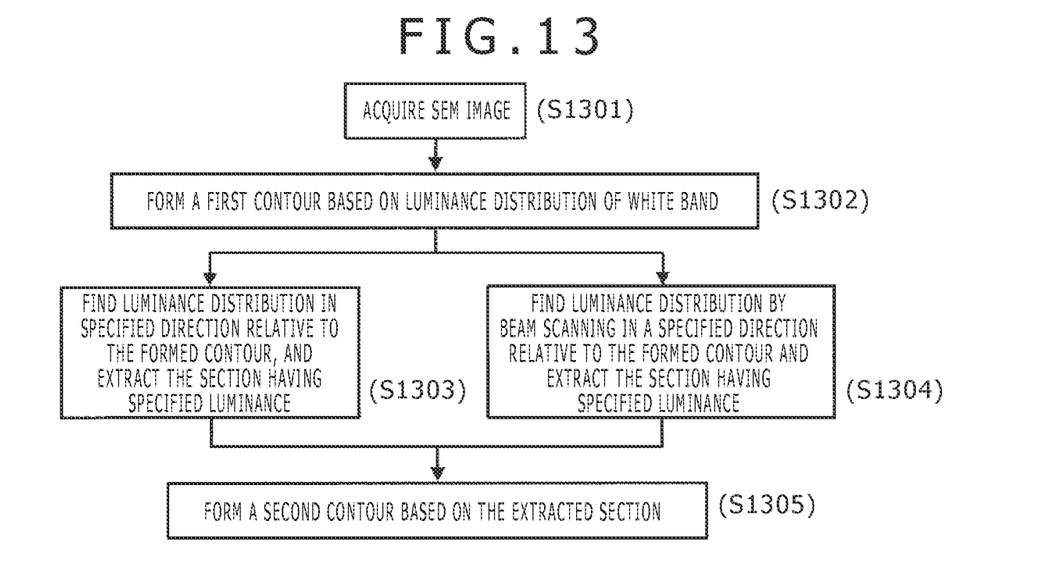
FIG. 13 is a flow chart showing the contour fabrication process.
Figure 14:
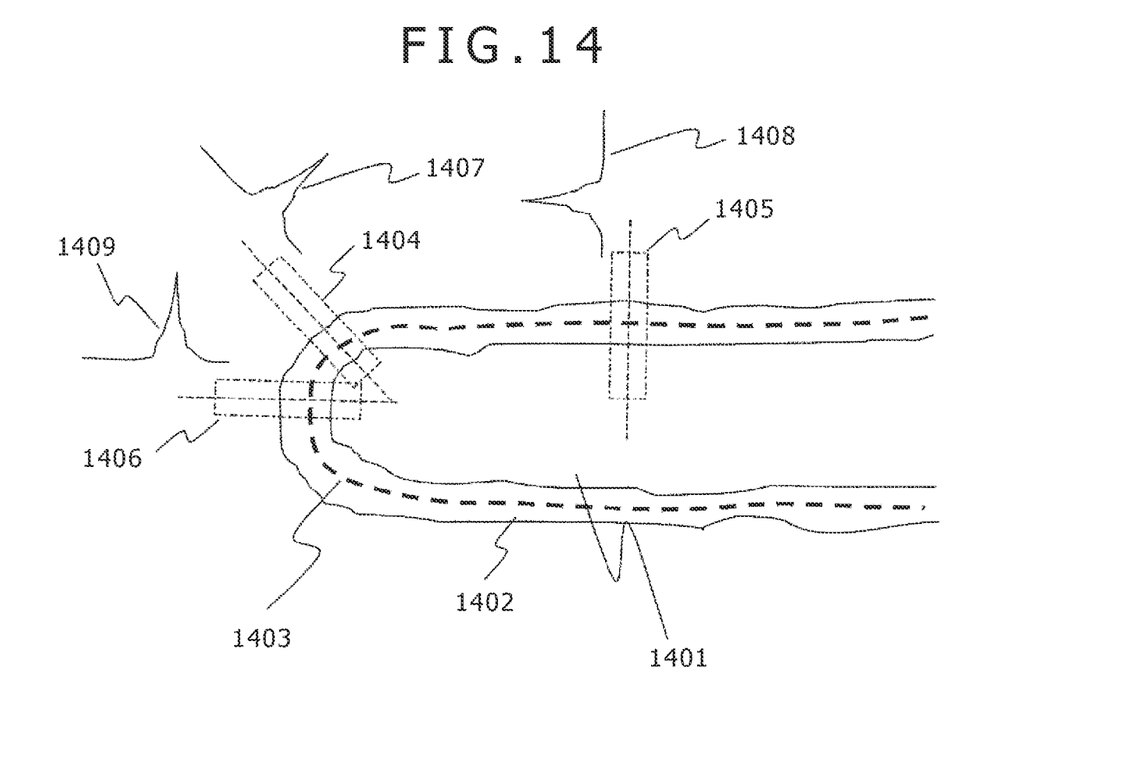
FIG. 14 is a drawing showing the contour fabrication principle.

The contour extraction unit 1212 extracts the contour from the image data according to the flow chart such as illustrated for example in FIG. 13. FIG. 14 is a drawing showing an overview of the concept for the extracting that contour.

The contour extraction unit. 1212 first of all acquires the SEM image (step 1201). A first contour is next made based on the luminance distribution of the white band (step 1302). Here, the edge extraction is performed utilizing the white band method, etc. Next, the luminance distribution is found in a specified direction relative to the first contour that is formed, and a section having the specified luminance value is extracted (step 1303). The specified direction as referred to here is preferably a direction perpendicular to the first contour. A first contour 1403 is formed based on the white band 1402 for the line pattern 1401 as shown in FIG. 14, and a luminance distribution (1407 to 1409) in a direction perpendicular to the first contour is acquired by setting a luminance distribution capture region (1404 to 1406) relative to the first contour.

The first contour 1403 has a rough contour, but shows the approximate pattern shape so that the luminance distribution is detected from the appropriate contour as a reference standard in order to form a higher accuracy contour utilizing this contour as a reference standard. By detecting the luminance distribution in the perpendicular direction relative to the contour, the peak width of the profile can be narrowed, and consequently an accurate peak position can be detected. A high accuracy contour (second contour) can be formed for example by joining the peak top positions (in step 1405). A contour may also be formed such as by joining the specified bright sections without detecting the peak tops.

Moreover, to form a second contour, a profile is made by making an electron beam scan perpendicular to the first contour 1403 (step 1304) and a second contour can also be formed based on this profile.

The synthesized contour forming unit 1213 can for example create contour map data showing contours for design data from design data that was read out from the design data storage medium 1215, perform position alignment between plural contours utilizing the contour map data as a template, and average out the deviations at corresponding points on each contour to form a synthesized contour. This synthesized contour data or contour data on which the specified image process is performed on the synthesized contour is registered in the memory 1209 and utilized to evaluate patterns by the two dimensional shape evaluation unit 1214.

Figure 8:
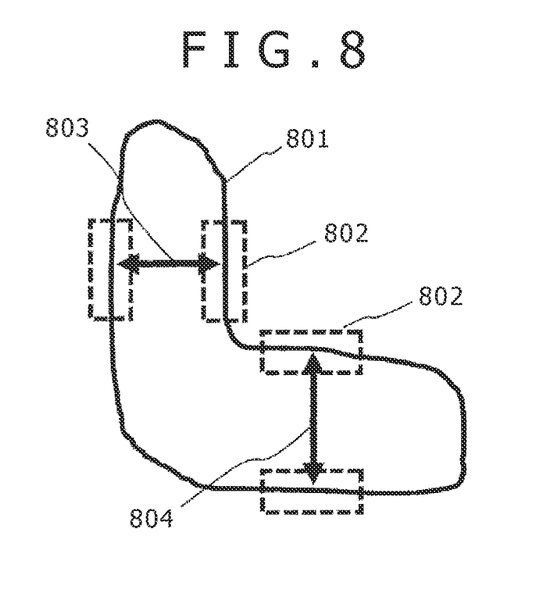
FIG. 8 is a drawing showing the relation between the one dimensional measurement position and the measurement position for the reference pattern.
Figure 9:
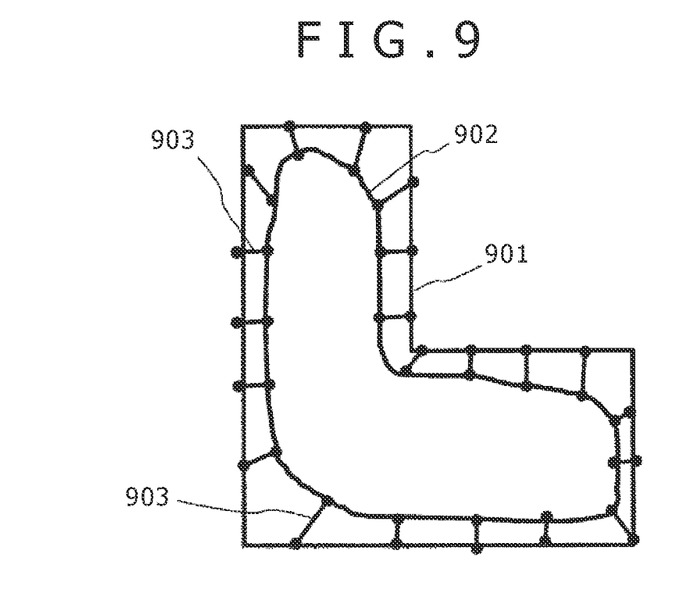
FIG. 9 is a drawing showing an overview of the EPE measurement.
Figure 10:
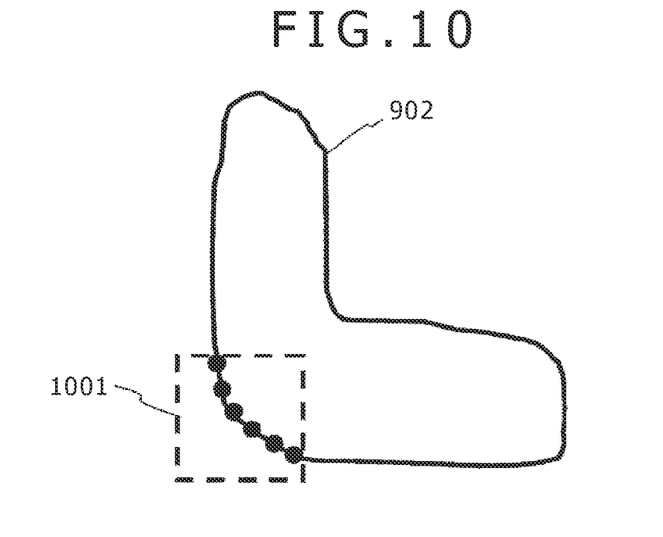
FIG. 10 is a drawing for describing an example for evaluating a designated section of the pattern.

The two dimensional shape evaluation unit 1214 implements the pattern evaluation utilizing a reference pattern (two dimensional shape pattern) based on evaluation methods such as illustrated in FIG. 8 through FIG. 10. In the example described in FIG. 8, the one dimensional evaluation target pattern and the reference pattern are the same however another pattern may also be utilized.

The pattern 801 illustrated in FIG. 8, is a pattern for performing one dimensional measurement (measurement of one dimensional measurement unit 803) utilizing a measurement box 802. The pattern 801 is a pattern for forming a reference pattern by synthesizing patterns with the same shape and having multiple identical exposure conditions.

After forming the reference pattern 801, an evaluation by the measurement unit 804 is made by utilizing this reference pattern. The measurement unit 804 is set in a direction perpendicular to the one dimensional measurement unit 803. When using a scanning electron microscope, an edge in the complementary horizontal direction relative to an edge perpendicular to the scanning direction (X direction) of the electron beam might not appear with sufficient contrast. So first of all, the one dimensional measurement unit 803 performs measurement, and after finding the exposure conditions sufficient for forming a reference pattern, forms a synthesized contour and on achieving a high accuracy contour line along the horizontal direction by synthesis, the measurement unit 804 performs an evaluation that allows attaining highly accurate dimensions in two directions, and narrowing down the exposure conditions by results from the two evaluations.

The narrowing down of exposure conditions is performed for example by setting ideal dimensions (e.g. dimensions from design data) beforehand, extracting exposure conditions for a pattern showing dimensional values for the ideal dimensions, or a specified range including ideal dimensions, and selecting a range where this exposure condition range overlaps the exposure condition range found from the first dimensional measurement as an appropriate exposure condition range (process window region).

FIG. 9 is a drawing showing an example of measurement for dimension measurement point 903 between plural corresponding points on the synthesized contour 902 and contour map data 901 formed based on the design data. When making the EPE (Edge Placement Error) measurement, the dimensions along plural directions of the pattern are evaluated, so that evaluation results can be obtained that are only possible by way of two dimensional measurement, and cannot be acquired through one dimensional measurement. In one dimensional, measurement for example, one might not know if measurement results show different values due to noise. However, as can be seen in the example in FIG. 9, by measuring the entire circumference, and averaging that measurement, a decision can be made whether the pattern is overall expanding or shrinking relative to the design data.

When noise for example becomes superimposed on the one dimensional measurement results and a judgment is made that the pattern is expanding relative to the design data, and conversely when the average value is shrinking along the entire circumference, one can perceive that there is basically an error in the one dimensional measurement results. A judgment can therefore be made on whether the selection of a reference pattern is correct or not based on a comparison of she one dimensional measurement results and the two dimensional measurement results.

FIG. 10 is a drawing showing an example of the two dimensional evaluation object which is a portion of the synthesized contour 902. The evaluation target region 1001 includes a corner section of the synthesized contour 902. A designated threshold range may be set for the curvature of this corner section and EPE measurement results, and the exposure conditions contained in the range may be set as the process window region based on two dimensional evaluation results. For example when an ideal corner curvature is known based on experience, setting this threshold range allows specifying the process window region based on the two dimensional evaluation results. The curvature can be calculated for example by fitting an approximate function to the contour.

A process window region can in this way be selected based on a two dimensional evaluation of the pattern by using the above described shape evaluation parameters as objects for comparison with the reference pattern.

The example in the present embodiment described using a SEM as the image capture device however an evaluation that makes a first dimensional measurement or a second dimensional pattern using an image acquired by other charged particle devices such as a focused ion beam. (FIB) may also be performed.

Figure 11:
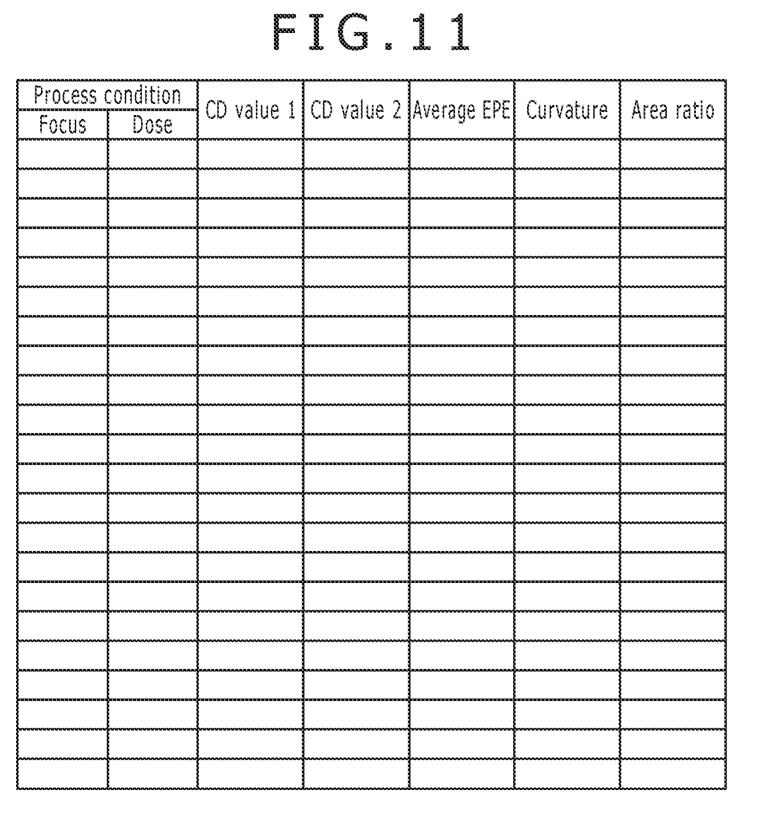
FIG. 11 is a table for showing one example of a database for storing by linking exposure conditions and pattern evaluation results.

A process window such as illustrated in FIG. 6 can formed by storing the one dimensional measurement results and the two dimensional evaluation results obtained as described above, in a database shown as an example in FIG. 11. A combination of focus quantity (focus) and dose quantity (dose) are stored as exposure conditions (process conditions) in the database shown as an example in FIG. 11, and the database can store the one dimensional measurement results and two dimensional evaluation results linked with the focus and dose quantity combinations. A measurement result for the one dimensional measurement unit 803 shown as an example in FIG. 8 may be stored in a CD value 1, and the measurement result for a measurement unit 804 may be stored in a CD value 2. The average (arithmetic mean) of the EPE measurement results shown as an example in FIG. 9 may be stored in the Average EPE. Moreover, the curvature of the pattern of the evaluation target region shown as an example in FIG. 10 may be stored in Curvature. Further, the area ratio of the synthesized contour and the evaluation target pattern can be found from the number of pixels within the contour and that ratio may be stored in Area ratio.

In the present embodiment, the process window region can be narrowed down by process window analysis based on one dimensional measurement results, and process window analysis utilizing at least one reference pattern. If further narrowing down by using plural two dimensional evaluation results is possible, the process window could be narrowed down even further or a judgment could be made whether the first dimensional measurement results are applicable or not.

The flow chart in FIG. 7 is next described in detail. An FEM wafer is loaded into the sample chamber within the scanning electron microscope unit 1201 (step 701). Exposure conditions for the pattern formed over the FEM wafer are stored in the memory 1209, etc. along with that position information. Next, measurement is made of specified one dimensional measurement section of patterns having the same shape in the design data on the different exposure condition regions (step 702).

In the present embodiment, a specified number of measurements are made in order to identify appropriate process window regions capable of being judged based on the one dimensional measurement, and after completing the measurements; a pattern where the one dimensional measurement result is closest to the design value, a pattern closest to the one dimensional measurement results optionally set by the operator, or a pattern contained within the one dimensional measurement result range optionally set by the operator is identified (step 703).

Next, images of plural identical shaped patterns in the design data are acquired from among the patterns formed under the same exposure conditions as the identified pattern (step 704). A template of pattern serving as the basis for the reference pattern may here for example be stored beforehand, if the matching processor unit 1210 can specify a position by pattern matching, the generating of reference patterns can be automated. The contour extraction unit 1212 forms the contours based on the image data acquired as described above (step 705). The synthesized contour forming unit 1213 forms reference patterns by synthesizing the contours of plural patterns that are identical shaped patterns formed in this way in the design data and placed at different positions, along with forming the patterns under the identical exposure conditions (step 706).

The reference pattern formed as described above is considered similar to a certain extent to patterns formed under ideal exposure conditions and therefore utilizing this reference pattern as an object for comparison allows selecting an approximate range for exposure conditions.

A pattern evaluation is made in a direction different from the one dimensional measurement direction and an evaluation of a two dimensional shape is made by utilizing a reference pattern formed as described above (step 707).

In the measurements and evaluations made so far, a range capable of allowing judgment of appropriate exposure conditions based on one dimensional measurements, and a region capable of allowing judgment of appropriate exposure conditions by evaluations utilizing a reference pattern can be specified so that the process window is narrowed down from AND conditions for both (overlapping range in process window), and the narrowed down process window information is stored in the memory 1209, etc.

The above described structure is capable of forming a reference pattern with information that is accurate to a certain extent and is also capable of narrowing down the process window based on identification information in the plural process windows.

LIST OF REFERENCE SIGNS

1201 Scanning electron microscope unit
1202 Scanning deflector
1203 Detector
1204 Control device
1205 Arithmetic processing device
1206 Procedure execution unit
1207 Image processor unit
1208 Process window evaluation unit
1209 Memory
1210 Matching processor unit
1211 One dimensional measurement unit
1212 Contour extraction unit
1213 Synthesized contour forming unit
1214 Two dimensional shape evaluation unit
1215 Design data storage media
1216 Simulator
1217 Input-output device

The invention claimed is:

1. A system comprising:
a charged particle beam irradiation tool, including:
a stage configured to support a wafer; and
a controller communicatively coupled to the charged particle beam irradiation tool, the controller including a processor, wherein the processor is configured to execute a program instruction stored in memory, the program instruction configured to cause the controller to:
control the charged particle beam irradiation tool and the stage to perform a one-dimensional measurement of a plurality of patterns that have a same shape as each other and are exposed under different exposure conditions including a dose quantity and a focus value that are selected for the one-dimensional measurement;
determine a coordinate of a pattern having a dimension value which is equal to a stored dimension value, or the coordinate of the pattern having a dimension value within a predetermined range of dimension values including the stored dimension value;
control the charged particle beam irradiation tool and the stage to generate images of the plurality of patterns of the same shape exposed under a same exposure condition as the determined coordinate, or under a first exposure condition of a first area adjacent to a second area exposed by the first exposure condition as the determined coordinate;
extract a contour by an image processing for each of the images, and synthesize the extracted contours to generate a synthesized contour; and
evaluate the patterns included in the images using the synthesized contour.

2. The system according to claim 1,
wherein the processor includes a storage medium that stores a tolerance range of a shape evaluation parameter of a reference pattern, and extracts a range of a second exposure condition for a pattern contained within the tolerance range.

3. The system according to claim 2,
wherein the processor selects an overlapped range for a range of the first exposure condition, and the range of the second exposure condition.

4. The system according to claim 1,
wherein the processor selects a pattern whose dimensional measurement results satisfy specified conditions or exposure conditions by which the pattern is formed, based on dimensional measurements made for the plurality of patterns having different exposure conditions.

5. A non-transitory computer-readable medium storing a program operating on a computer that scans a plurality of patterns formed with different exposure conditions by an exposure apparatus to obtain images from a charged particle beam irradiation tool, including a stage configured to support a wafer, the program performing instructions comprising:
controlling the charged particle beam irradiation tool and the stage to perform a one-dimensional measurement of a plurality of patterns that have a same shape as each other and are exposed under different exposure conditions including a dose quantity and a focus value that are selected for the one-dimensional measurement;
determining a coordinate of a pattern having a dimension value which is equal to a stored dimension value, or the coordinate of the pattern having a dimension value within a predetermined range of dimension values including the stored dimension value;
controlling the charged particle beam irradiation tool and the stage to generate images of the plurality of patterns of the same shape exposed under a same exposure condition as the determined coordinate, or under a first exposure condition of a first area adjacent to a second area exposed by the first exposure condition as the determined coordinate;
extracting a contour by an image processing for each of the images, and synthesize the extracted contours to generate a synthesized contour; and
evaluating the patterns included in the images using the synthesized contour.

6. The non-transitory computer-readable medium according to claim 5,
wherein the program operating on the computer extracts a range of a second exposure condition for a pattern contained within a tolerance range of a shape evaluation parameter stored in advance.

7. The non-transitory computer-readable medium according to claim 6, wherein the program operating on the computer selects the overlap range for a range of the first exposure condition, and the range of the second exposure condition.

8. The non-transitory computer-readable medium according to claim 5,
wherein the program operating on the computer selects a pattern whose dimensional measurement results satisfy specified conditions or exposure conditions by which the pattern is formed, based on dimensional measurements made for the plurality of patterns having different light exposure conditions.

\* \* \* \* \*